United States Patent
Tang et al.

(10) Patent No.: US 10,930,198 B2
(45) Date of Patent: Feb. 23, 2021

(54) SHIFT REGISTER UNIT AND DRIVING METHOD THEREOF, GATE DRIVING CIRCUIT AND DISPLAY PANEL

(71) Applicants: BOE TECHNOLOGY GROUP CO., LTD., Beijing (CN); Hefei BOE Optoelectronics Technology Co., Ltd., Anhui (CN)

(72) Inventors: Fengjing Tang, Beijing (CN); Zhifu Dong, Beijing (CN); Jian Tao, Beijing (CN); Hongmin Li, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 128 days.

(21) Appl. No.: 16/174,634

(22) Filed: Oct. 30, 2018

(65) Prior Publication Data

US 2019/0251891 A1 Aug. 15, 2019

(30) Foreign Application Priority Data

Feb. 14, 2018 (CN) .......................... 201810151810.5

(51) Int. Cl.
*G11C 19/00* (2006.01)
*G09G 3/20* (2006.01)
(Continued)

(52) U.S. Cl.
CPC ............ *G09G 3/2092* (2013.01); *G09G 3/20* (2013.01); *G09G 3/3266* (2013.01);
(Continued)

(58) Field of Classification Search
None
See application file for complete search history.

(56) References Cited

U.S. PATENT DOCUMENTS

| 9,905,312 B2* | 2/2018 | Nonaka ................. G11C 19/28 |
| 2015/0318052 A1* | 11/2015 | Li ......................... G11C 19/28 |
| | | 377/64 |

(Continued)

FOREIGN PATENT DOCUMENTS

| CN | 1628334 | 6/2005 |
| CN | 1744184 | 3/2006 |

(Continued)

OTHER PUBLICATIONS

Office action from Chinese Application No. 2018101518105 dated Sep. 3, 2020.

*Primary Examiner* — Tuan T Lam
(74) *Attorney, Agent, or Firm* — Calfee, Halter & Griswold LLP

(57) ABSTRACT

The disclosure relates to a shift register unit, a driving method of shift register units, a gate driving circuit and a display panel. The shift register unit includes: an input module, a pull-up module, a storage capacitor, an output module configured to transmit a first voltage signal to a signal output terminal under the control of the first voltage signal; and an output control module configured to transmit the first voltage signal or a second power signal to the signal output terminal under the control of the voltage signal of the pull-up node and a first selection signal, and to transmit the first voltage signal or the second power signal to the signal output terminal under the control of the voltage signal of the pull-up node and a second selection signal.

13 Claims, 4 Drawing Sheets

(51) Int. Cl.
*G11C 19/28* (2006.01)
*G09G 3/3266* (2016.01)
*G09G 3/36* (2006.01)
*G11C 7/02* (2006.01)

(52) U.S. Cl.
CPC ............ *G09G 3/3677* (2013.01); *G11C 7/02* (2013.01); *G11C 19/28* (2013.01); *G11C 19/287* (2013.01); *G09G 2310/0202* (2013.01); *G09G 2310/0267* (2013.01); *G09G 2310/0286* (2013.01)

(56) References Cited

U.S. PATENT DOCUMENTS

| | | | | |
|---|---|---|---|---|
| 2016/0329015 | A1* | 11/2016 | Ji | G09G 3/32 |
| 2016/0358566 | A1* | 12/2016 | Li | G11C 19/28 |
| 2016/0372069 | A1* | 12/2016 | Lv | G09G 3/36 |
| 2017/0039968 | A1* | 2/2017 | Chen | G09G 3/3648 |
| 2017/0193889 | A1* | 7/2017 | Li | G09G 3/20 |
| 2018/0151122 | A1* | 5/2018 | Ding | G06K 9/00993 |
| 2018/0315389 | A1* | 11/2018 | Hong | G09G 3/20 |
| 2018/0322820 | A1* | 11/2018 | Yang | G09G 3/20 |
| 2019/0012973 | A1* | 1/2019 | Wang | G11C 19/28 |
| 2019/0073948 | A1* | 3/2019 | Wang | G09G 3/3225 |
| 2019/0115090 | A1* | 4/2019 | Tao | G11C 19/287 |

FOREIGN PATENT DOCUMENTS

| | | |
|---|---|---|
| CN | 103098140 | 5/2013 |
| CN | 103261951 | 8/2013 |
| CN | 104810058 | 7/2015 |
| CN | 106875911 | 6/2017 |

\* cited by examiner

SHIFT REGISTER UNIT AND DRIVING METHOD THEREOF, GATE DRIVING CIRCUIT AND DISPLAY PANEL

CROSS REFERENCE

The present disclosure claims priority to Chinese Patent Application No. 201810151810.5, filed on Feb. 14, 2018, and the entire contents thereof are incorporated herein by reference.

TECHNICAL FIELD

The present disclosure relates to the technical field of display technology, and in particular, to a shift register unit, a driving method of the shift register unit, a gate driving circuit, and a display panel.

BACKGROUND

With the development of optical technology and semiconductor technology, flat panel displays represented by liquid crystal displays (LCDs) and organic light emitting diodes (OLEDs), which features light weight, low power consumption, fast response, good color purity, and high contrast, dominate the display field.

In recent years, display devices have shown a trend of high integration and low cost. Represented by the Gate Driver on Array (GOA) technology, the GOA technology is used to integrate the gate drive circuit into the peripheral area of the array substrate, thereby effectively improving the integration of the display device while achieving a narrow bezel design. And reduce its manufacturing costs. The output of each stage of the shift register unit in the GOA circuit is coupled to a corresponding gate line and is configured to output a gate scanning signal to the gate line to implement a progressive scan function.

It should be noted that the information disclosed in the Background section above is only for enhancing the understanding of the background of the present disclosure, and thus may include information that does not constitute prior art known to those of ordinary skill in the art.

SUMMARY

The present disclosure provides a shift register unit, a gate driving circuit, a driving method of the shift register unit, and a display panel.

According to one aspect of the present disclosure, there is provided a shift register unit including:

an input circuit, configured to transmit a first power signal to a pull-up node under control of an input signal;

a pull-up circuit, configured to transmit a clock signal to a first node under control of a voltage signal of the pull-up node;

a storage capacitor, connected between the pull-up node and the first node;

an output circuit, configured to transmit a first voltage signal to a signal output terminal under control of the first voltage signal; and an output control circuit, configured to transmit the first voltage signal or a second power signal to the signal output terminal under control of the voltage signal of the pull-up node and a first selection signal, and to transmit the first voltage signal or the second power signal to the signal output terminal under control of the voltage signal of the pull-up node and a second selection signal.

In an exemplary embodiment of the present disclosure, the output control circuit includes:

a first switching element, having a control end connected to the pull-up node, a first end configured to receive the second power supply signal, and a second end connected to a first end of a second switching element;

having a control end configured to receive at least one of the first selection signal and the second selection signal, the first end connected to the second end of the first switching element, and a second end connected to a control end of a third switching element; and the third switching element, having the control end connected to the second end of the second switching element, a first end configured to receive the second power signal, and a second end connected to the signal output terminal.

In an exemplary embodiment of the present disclosure, the output circuit includes:

a fourth switching element, having a control end and a first end both configured to receive the first voltage signal, and a second end connected to a control end of a third switching element; and a fifth switching element, having a control end and a first end both configured to receive the first voltage signal, and a second end connected to the signal output terminal.

In an exemplary embodiment of the present disclosure, the shift register unit further includes:

a reset circuit, configured to transmit the second power signal to the pull-up node or to the first node under control of a reset signal; and a noise reduction circuit, configured to transmit the second power signal to the first node under control of the first voltage signal.

In an exemplary embodiment of the present disclosure, the input circuit includes:

a sixth switching element, having a control end configured to receive the input signal, a first end configured to receive the first power signal, and a second end connected to the pull-up node.

In an exemplary embodiment of the present disclosure, the pull-up circuit includes:

a seventh switching element, having a control end connected to the pull-up node, a first end configured to receive the clock signal, and a second end connected to the first node.

In an exemplary embodiment of the present disclosure, the noise reduction circuit includes:

an eighth switching element, having a control end connected to the pull-up node, a first end configured to receive the second power signal, and a second end connected to a control end of a ninth switching element;

the ninth switching element, having the control end connected to the second end of the eighth switching element, a first end configured to receive the second power signal, and a second end connected to the first node; and a tenth switching element, having a control end and a first terminal both configured to receive the first voltage signal, and a second end connected to the control end of the ninth switching element.

In an exemplary embodiment of the present disclosure, the reset circuit includes:

an eleventh switching element, having a control end configured to receive the reset signal, a first end configured to receive the second power signal, and a second end connected to the pull-up node; and a twelfth switching element, having a control end configured to receive the reset signal, a first end configured to receive the second power signal, and a second end connected to the first node.

According to one aspect of the present disclosure, there is provided a gate driving circuit, including:

a plurality of cascaded shift register units according to the first aspect, wherein, an output signal of the signal output terminal of an Mth cascaded shift register unit is used as the input signal of an (M+3)th cascaded shift register unit; and an output signal of the signal output terminal of the (M+3)th cascaded shift register unit is used as a reset signal of the Mth cascaded shift register unit.

In an exemplary embodiment of the present disclosure, the clock signals of adjacent two rows of the cascaded shift register units having substantially inverse phases.

In an exemplary embodiment of the present disclosure, a scanning mode of the gate driving circuit includes a forward scanning, and the first power signal is at a logic high level, and the second power signal is at a logic low level.

In an exemplary embodiment of the present disclosure, a scanning mode of the gate driving circuit includes a reverse scanning, and the first power signal is at a logic low level, and the second power signal is at a logic high level.

According to one aspect of the present disclosure, there is provided a driving method of the shift register unit, which is configured to drive the shift register unit according to the above aspect, including:

when the first selection signal, the second selection signal, and the voltage signal of the pull-up node are all at a logic high level, the first voltage signal is transmitted to the signal output terminal; and when the first selection signal, the second selection signal, and/or the voltage signal of the pull-up node is at a logic low level, the second power signal is transmitted to the signal output terminal According to one aspect of the present disclosure, there is provided a display panel, including a display area and a peripheral area; wherein the gate driving circuit according to the above aspect is provided in the peripheral area.

It is to be understood that both the foregoing general description and the following detailed description are exemplary and explanatory only and are not restrictive of the disclosure.

This section provides a general description for various implementations or examples of the technology as described in the present disclosure, which, however, is not a comprehensive disclosure for the entire protection scope or all technical features of the technology of the present disclosure.

BRIEF DESCRIPTION OF THE DRAWINGS

The accompanying drawings, which herein are incorporated in and constitute a part of this specification, illustrate embodiments consistent with the present disclosure, and serve to explain the principles of the disclosure together with the specification. Obviously, the drawings in the following description are merely some of the embodiments of the present disclosure. Those skilled in the art can also obtain other drawings based on these drawings without any creative work.

Figure 1:
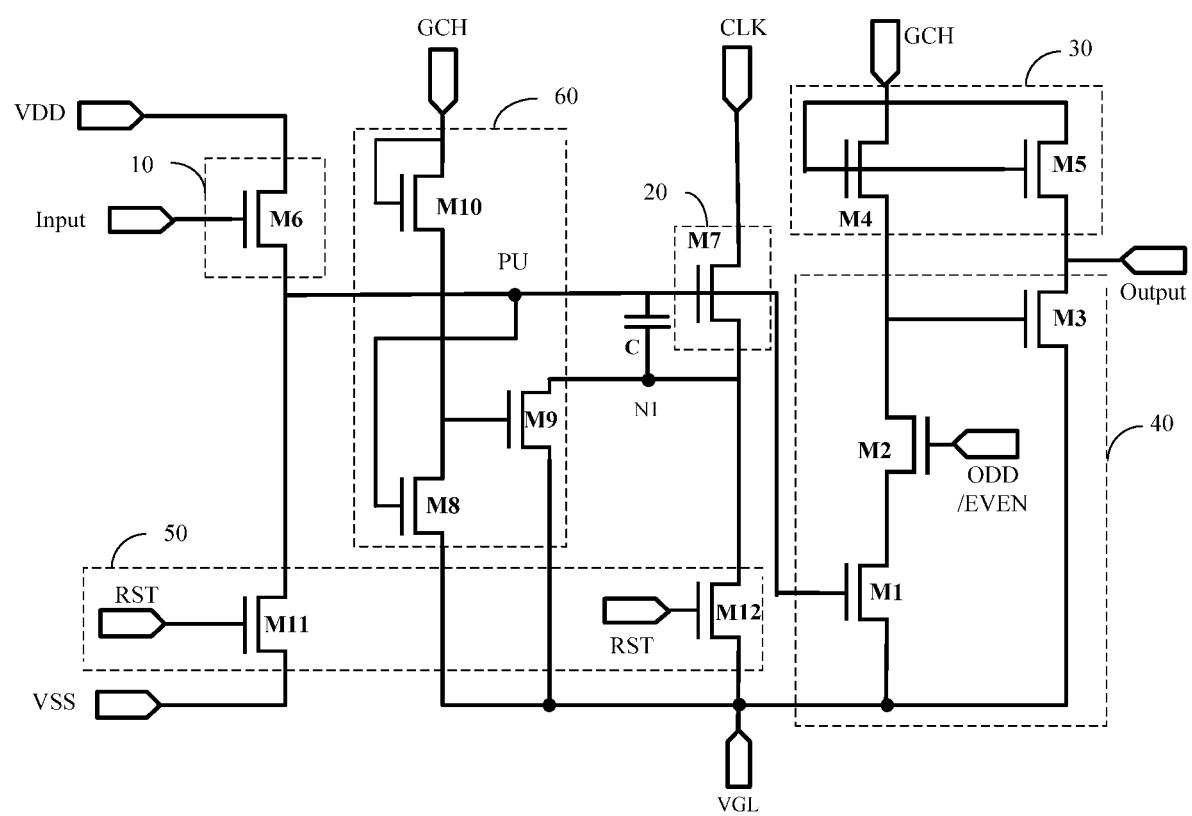
FIG. 1 is a schematic block diagram showing a structure of a shift register unit in an exemplary embodiment of the present disclosure.

| | |
|---|---|
| M1-M12 | first switching element-twelfth switching element |
| C | storage capacitor |
| Input | input signal |
| Output | signal output terminal |
| PU | pull-up node |
| N1 | first node |
| CLK | clock signal |
| CLK1-CLK6 | first clock signal-sixth clock signal |
| RST | reset signal |
| VDD | first power signal |
| VGL/VSS | second power signal |
| GCH | first voltage signal |
| ODD | first selection signal |
| EVEN | first selection signal |

DETAILED DESCRIPTION

Exemplary embodiments will now be described more fully with reference to the accompanying drawings. However, the exemplary embodiments can be implemented in various ways and should not be construed as limited to the examples set forth herein. Rather, these embodiments are provided to render the present disclosure to be more full and complete, and fully convey the concept of the exemplary embodiments to those skilled in the art. The described features, structures, or characteristics may be combined in any suitable manner in one or more embodiments.

Moreover, the drawings are merely schematic illustration of the present disclosure and are not necessarily drawn to scale. The same reference numerals in the drawings denote the same or similar parts, and their repeated description will be omitted. Some of the block diagrams shown in the figures are functional entities and do not necessarily have to correspond to physically or logically independent entities. These functional entities may be implemented in software, or implemented in one or more hardware modules or integrated circuits, or implemented in different network and/or processor devices and/or microcontroller devices.

The present exemplary embodiment proposes a shift register unit for providing a gate scanning signal to control the turning on and the turning off of a TFT, thereby realizing the transmission of signals. As shown in FIG. 1, the shift register unit may include the followings.

An input module 10, which is configured to transmit a first power signal VDD to a pull-up node PU under the control of an input signal Input.

A pull-up module 20, which is configured to transmit a clock signal CLK to a first node N1 under the control of a voltage signal of the pull-up node PU.

A storage capacitor C, which is connected between the pull-up node PU and the first node N1.

An output module 30, which is configured to transmit a first voltage signal GCH to a signal output terminal Output under the control of the first voltage signal GCH.

An output control module 40, which is configured to transmit the first voltage signal GCH or a second power signal VGL to the signal output terminal Output under the control of the voltage signal of the pull-up node PU and a first selection signal ODD, and is configured to transmit the first voltage signal GCH or the second power signal VGL to the signal output terminal Output under the control of the voltage signal of the pull-up node PU and a second selection signal EVEN.

In addition, the shift register unit may further include the following.

A noise reduction module 50, which is configured to transmit the second power signal VGL to the first node N1 under the control of the first voltage signal GCH.

A reset module 60, which is configured to transmit the second power signal VGL to the pull-up node PU or to the first node N1 under the control of a reset signal RST.

The shift register unit provided by the exemplary embodiment of the present disclosure transmits a logic high level signal or logic low level signal to the signal output terminal under the control of the voltage signal pull-up node together with the first selection signal and/or the second selection signal of the output control circuit, thereby realizing the selective output of signals, further realizing selective scanning and two-way scanning at the same time, improving the detection precision, and providing more display images.

With reference to FIG. 1, the shift register unit in the present exemplary embodiment will be described in detail below. As shown in FIG. 1, taking a first switching element to a twelfth switching element as N-type transistors as an example, the control end may be the gate of the transistor, the first end may be the source of the transistor, and the second end may be the drain of the transistor. At meantime, it should be noted that the source and drain of a transistor are not strictly distinguished, so it is also possible that the first end is the drain of the transistor and the second end is the source of the transistor.

Specifically, the input module 10 may include a sixth switching element M6, whose control end is configured to receive the input signal Input, first end is configured to receive the first power signal VDD, and second end configured to connect to the pull-up node PU.

The pull-up module 20 may include a seventh switching element M7, whose control end is connected to the pull-up node PU, first end is for receiving the clock signal CLK, and second end is connected to the first node N1.

The output module 30 may include a fourth switching element M4 and a fifth switching element M5. The control end and the first end of the fourth switching element M4 are both configured to receive the first voltage signal GCH, and the second end of the fourth switching element M4 is connected to the control end of a third switching element M3. The control end and the first end of the fifth switching element M5 are both configured to receive the first voltage signal GCH, and the second end of the fifth switching element M5 is connected to the signal output terminal Output.

The output control module 40 may include a first switching element M1, a second switching element M2, and a third switching element M3. Specifically, for the first switching element M1, the control end connected to the pull-up node PU, the first end is configured to receive the second power supply signal VGL, and the second end is connected to the first end of the second switching element M2. For the second switching element M2, the control end is for receiving the first selection signal ODD and/or for receiving the second selection signal EVEN, the first end is connected to the second end of the first switching element M1, and the second end is connected to the control end of the third switching element M3. For the third switching element M3, the control end is connected to the second end of the second switching element M2, the first end is for receiving the second power signal VGL, and the second end is connected to the signal output terminal Output.

The noise reduction module 50 may include an eighth switching element M8, a ninth switching element M9, and a tenth switching element M10. Specifically, for the eighth switching element M8, the control end is connected to the pull-up node PU, the first end is configured to receive the second power signal VGL, and the second end is connected to the control end of the ninth switching element M9. For the ninth switching element M9, the control end is connected to the second end of the eighth switching element M8, the first end is for receiving the second power signal VGL, and the second end is connected to the first node N1. For the tenth switching element M10, the control end and the first terminal are both configured to receive the first voltage signal GCH, and the second end is connected to the control end of the ninth switching element M9. The switching elements in the noise reduction module can reduce noise during the non-output time, which maintain the logic low level of the output, thereby preventing false output.

The reset module 60 may include an eleventh switching element M11 and a twelfth switching element M12. Specifically, for the eleventh switching element M11, the control end is configured to receive the reset signal RST, the first end is configured to receive the second power signal VSS, and the second end is connected to the pull-up node PU. For the twelfth switching element M12, the control end is for receiving the reset signal RST, the first end is for receiving the second power signal VGL, and the second end is connected to the first node N1. The reset module is configured to pull down the voltage signal of the pull-up node PU and pull down the voltage signal of the first node N1.

In this exemplary embodiment, all of the switching elements may be MOS transistors (Metal Oxide Semiconductors) or transistors, in particular, the first switching element to the twelfth switching element may be N-type MOS transistors. In addition, a P-type MOS transistors can also be used for the first switching element to the twelfth switching element. It should be noted that the level signals of the respective signal terminals need corresponding adjustment changes for different transistor types.

Figure 2:
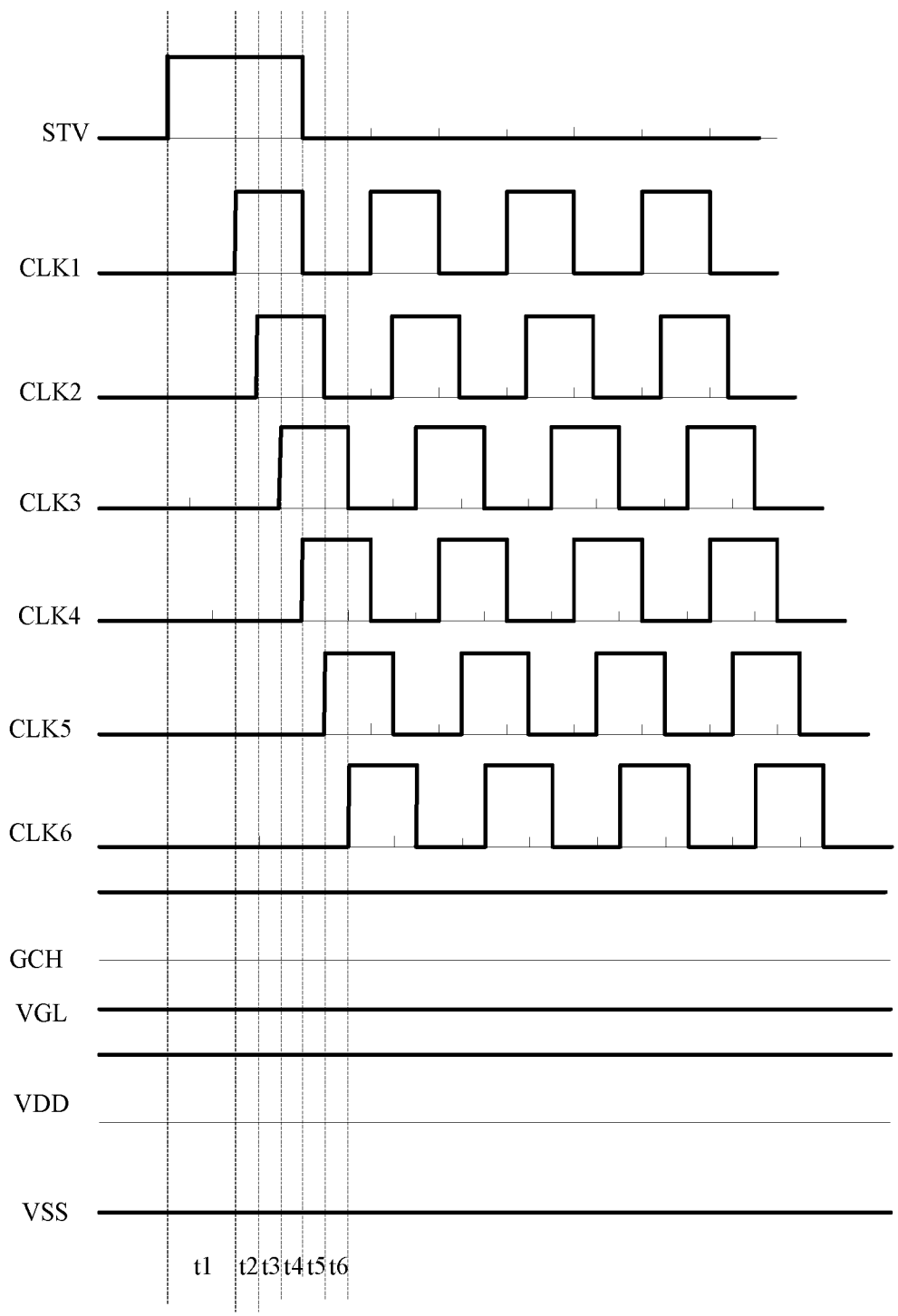
FIG. 2 schematically shows an operation timing chart of a forward scan of a shift register unit in an exemplary embodiment of the present disclosure.
Figure 3:
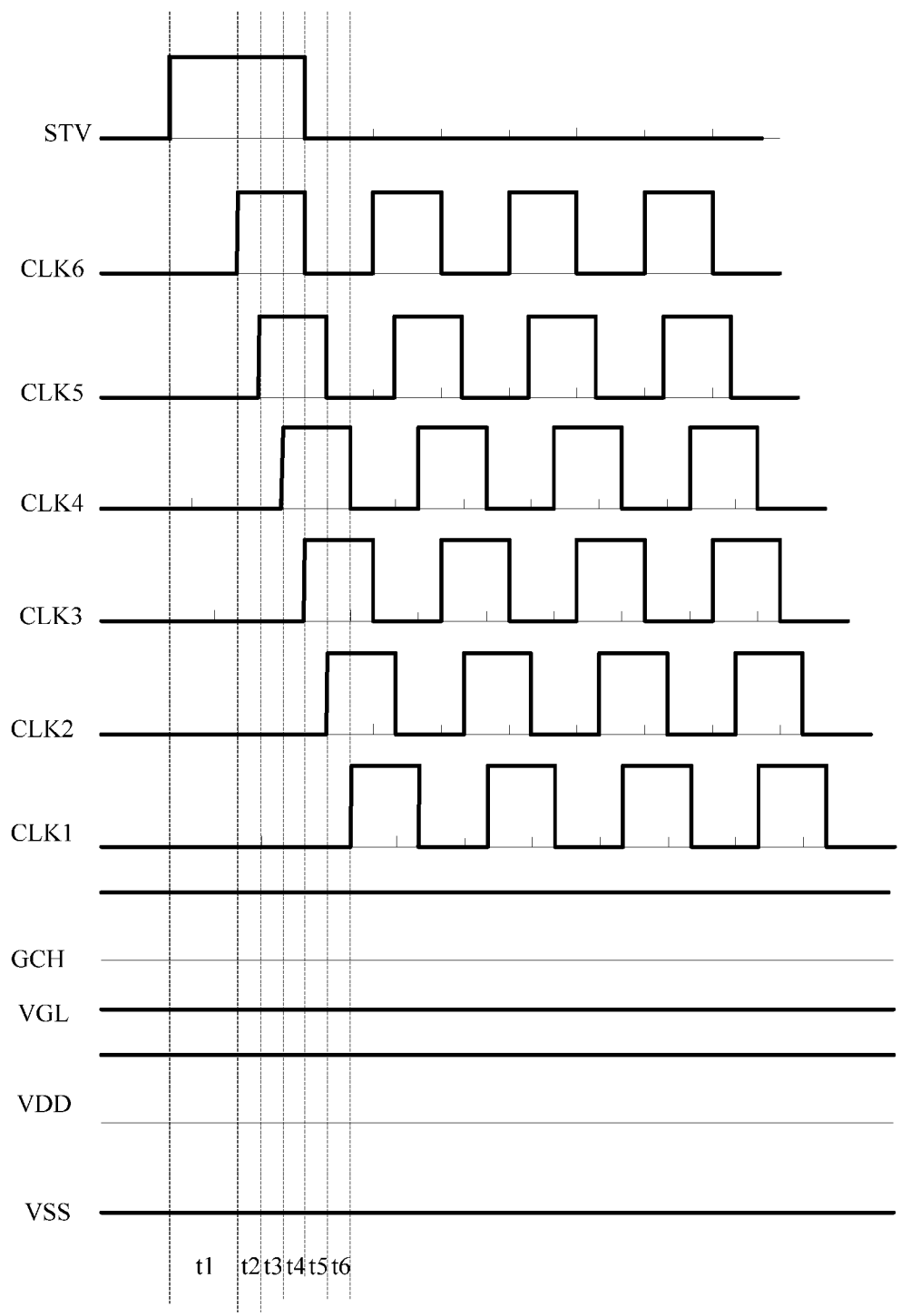
FIG. 3 schematically shows an operation timing chart of a reverse scan of a shift register unit in an exemplary embodiment of the present disclosure.
Figure 4:
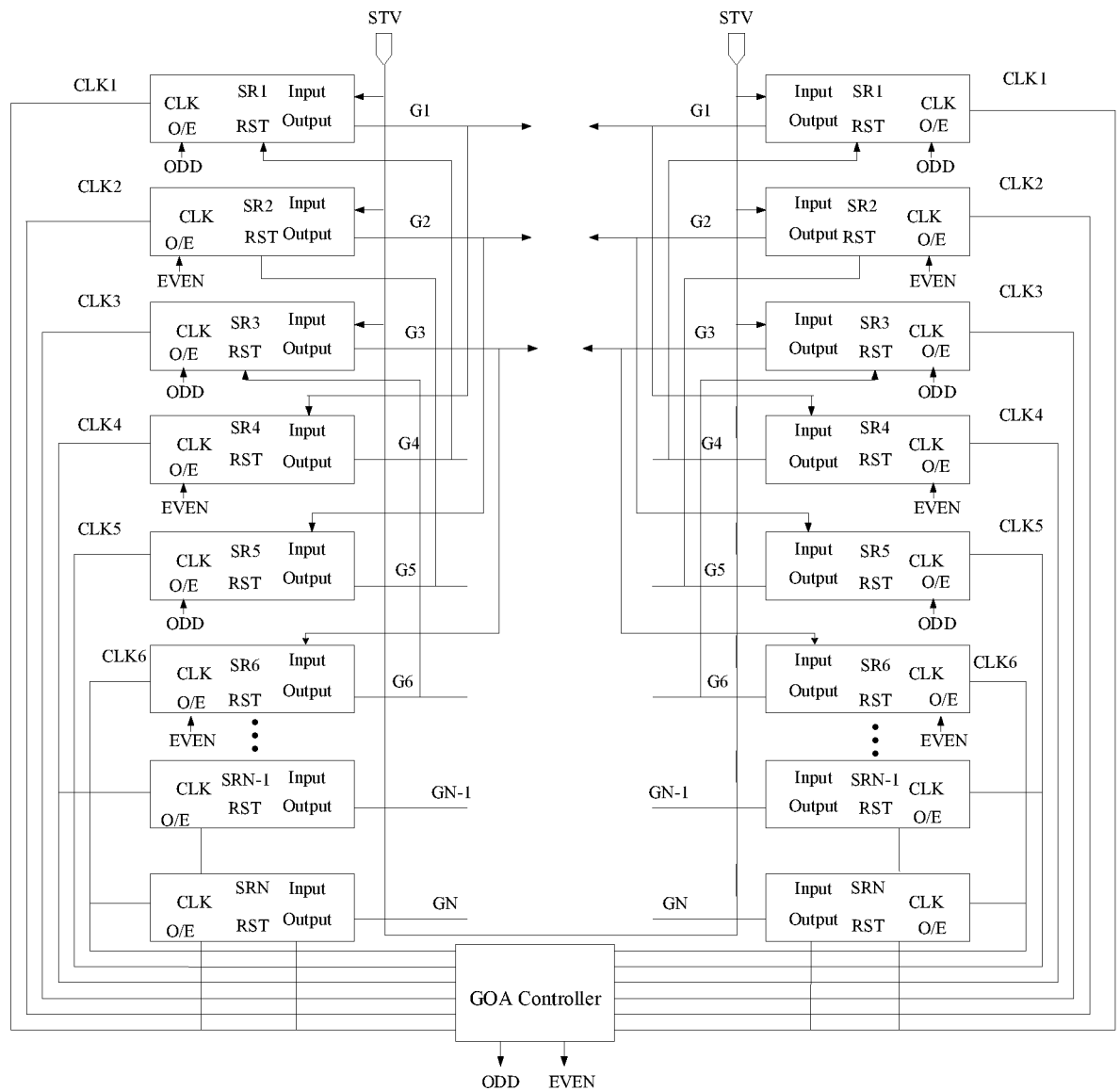
FIG. 4 schematically shows a cascade structure diagram of a gate driving circuit in an exemplary embodiment of the present disclosure.

Hereinafter, in conjunction with the forward scan operation timing chart shown in FIG. 2 and the cascade relationship diagram shown in FIG. 4, the operation principle of the shift register unit at each stage of the control timing will be specifically described, respectively. In the embodiment, the first power signal VDD is a logic high level signal, the second power signal VGL/VSS is a logic low level signal, the first voltage signal GCH is a logic high level signal, the first selection signal ODD and the second selection signal EVEN may be logic high level signal or logic low level signal.

The working process of the shift register unit may include the following stages, specifically.

First of all, it should be noted that the first voltage signal GCH is always a logic high level signal, so the fourth switching element and the fifth switching element remain on at all times. Each row of shift registers corresponds to one clock signal, respectively, so shift register units of the first row to the sixth row correspond to the first clock signal CLK1 to the sixth clock signal CLK6, respectively.

The first stage t1: in the case that the input signal Input of the shift register unit of the first three rows is the start signal STV, if the STV is a logic high level signal, the sixth switching element M6 of the shift register unit of each of the first three row is turned on under the action of the logic high level signal STV, so as to transmit the first power supply signal VDD to the pull-up node PU through the sixth switching element M6, thereby charging the storage capacitor C, and causing that the first switching element M1 to the seven switching element M7 are turned on under the control of the pull-up node PU.

The second stage t2: in the case that the clock signal CLK1 of the first row shift register unit in the first cascade changes from logic low to logic high, M1 would be turned on. In addition, since the signal of M9's control end is logic high, the voltage signal of the signal output terminal Output is logic high. That is, G(1) outputs logic high level signal, and G(1) acts as S(4) to provide an input signal to the shift register unit of the next cascade, so as to charge the pull-up node PU of the shift register unit of the fourth row.

The third stage t3: in the case that the clock signal CLK2 of the second row shift register unit in the first cascade changes from logic low to logic high, M1 would be turned on. In addition, since the signal of M9's control end is logic high, the voltage signal of the signal output terminal Output is logic high. That is, G(2) outputs logic high level signal, and G(2) acts as S(5) to provide an input signal to the shift register unit of the next cascade, so as to charge the pull-up node PU of the shift register unit of the fifth row.

The fourth stage t4: in the case that the clock signal CLK3 of the third row shift register unit in the first cascade changes from logic low to logic high, M1 would be turned on. In addition, since the signal of M9's control end is logic high, the voltage signal of the signal output terminal Output is logic high. That is, G(3) outputs logic high level signal, and G(3) acts as S(6) to provide an input signal to the shift register unit of the next cascade, so as to charge the pull-up node PU of the shift register unit of the sixth row.

Fifth stage t5: in the case that the clock signal CLK4 of the forth row shift register unit in the first cascade changes from logic low to logic high, as G(1) acts as S(4) to provide charge the pull-up node PU of the shift register unit of the forth row in the second stage, M1 is turned on. If the signal received by M9's control end is logic high, G(4) will output logic high level signal, G(4) will act as S(7) to provide an input signal to the shift register unit of the next cascade, and G(4) will act as RST1 to reset the shift register unit of the first row.

The sixth stage t6: the clock signal CLK5 changes from logic low to logic high. As G(2) acts as S(5) to provide charge the pull-up node PU of the shift register unit of the fifth row in the third stage, M1 is turned on. If the signal received by M9's control end is logic high, G(5) will output logic high level signal, G(5) will act as S(8) to provide an input signal to the shift register unit of the next cascade, and G(4) will act as RST2 to reset the shift register unit of the second row.

When receiving a reset signal of the next cascade, the voltage signal of the pull-up node PU is pulled down to the second power signal VSS by M11, and the voltage signal of the first node N1 is pulled down to the second power signal VGL by M12, therefore M1 is turned off, M3 is turned on, and the output signal of the signal output terminal Output is logic low.

As can be seen from the above, the signal output terminal Output is controlled by the voltage signal of the pull-up node, the signal ODD/EVEN of the control end of the second switching element M2 and the first voltage signal GCH. The first selection signal ODD is connected to the odd-numbered rows of the shift register units, and is used for controlling the output signals of the odd-numbered rows of the shift register units. The second selection signal EVEN is connected to the even-numbered rows in the shift register units, and is used for controlling the output signal of even rows in the shift register units.

When the voltage signal of the pull-up node PU is logic high level, M1 is turned on. When the control end of the second switching element M2 receives a logic high level signal, M2 is turned on, then the second power supply signal VGL is transmitted to the third switching element M3 through the first switching element M1 and the second switching element M2, and the third switching element M3 is turned off. At this time, the first voltage signal GCH is transmitted to the signal output terminal Output through the fifth switching element M5, so that the output signal of the signal output terminal Output is logic high, that is, the corresponding gate driving signal is logic high, therefore the corresponding TFT is turned on.

When the control end of the second switching element M2 receives a logic low level signal, M2 is turned off. The first voltage signal GCH is transmitted to the control end of the third switching element M3 through the forth switching element M4, therefore the third switching element M3 is turned on. At this time, the second power signal VGL is transmitted through the third switching element M3 to the signal output terminal Output, causing that the output signal of the signal output terminal Output is logic low level, that is, the corresponding gate driving signal is logic low level, therefore the corresponding TFT is turned off.

When the voltage signal of the pull-up node PU is logic low level, M1 is turned off. When the control end of the second switching element M2 receives a logic high level signal, M2 is turned on. At this time, the first voltage signal GCH is transmitted to the third switching element M3 through the forth switching element M4, then the third switching element M3 is turned on. The second power supply signal VGL is transmitted to the signal output terminal Output through the third switching element M3, causing that the output signal of the signal output terminal Output is logic low level, that is, the corresponding gate driving signal is logic low level, therefore the corresponding TFT is turned off.

In summary, only when M1 and M2 are turned on simultaneously, the output signal of the signal output terminal Output is a logic high level, causing the corresponding TFT is turned on and then realizing the detection. In this embodiment, the output control module may output odd rows by making the first selection signal ODD a logic high level signal, may output even rows by making the second selection signal EVEN a logic high level signal, and may output both odd rows and even rows by making the first selection signal ODD a logic high level signal and the second selection signal EVEN a logic high level signal at the same time.

It should be noted that, after the above sixth stage t6, the shift register units of each cascade repeat the progress of the second stage t2 to the sixth stage t6 according to actual conditions within one frame scanning time.

According to the above process, under the control of the voltage signal pull-up node together with the first selection signal and/or the second selection signal of the output control circuit, the logic high-level signal or the logic low-level signal is transmitted to the signal output terminal. It is possible to realize selective output of odd rows and outputting even rows, and further realize selective scanning and two-way scanning at the same time. Therefore, the detection precision is improved, and more display images are provided.

The present example embodiment also provides a gate driving circuit that can be applied to a GOA circuit including one or more clock signals CLK. As shown in FIG. 4, the gate driving circuit can include a plurality of cascaded shift register units. In this embodiment, an output signal of the signal output terminal Output of the Mth cascade shift register units is an input signal Input of the (M+3)th cascade shift register units. An output signal of the signal output terminal Output of the (M+3)th cascade shift register units is a reset signal RST of the Mth cascade shift register units. It should be noted that each row of shift register units corresponds to one clock signal, and the clock signals between the cascaded two rows of shift register units are in an inverse relationship with each other.

Specifically, the input signals of the first shift register unit SR1, the second shift register unit SR2, and the third shift register unit SR3 may each be a start signal STV. The input signal of the fourth shift register unit SR4 is the output signal of the first shift register unit SR1. The reset signal of the first shift register unit SR1 is the output signal of the fourth shift register unit SR4. It should be noted that when the clock signal CLK1 is at a logic high level, the clock signal CLK4 is at a logic low level.

Based on the above, the scanning mode of the gate driving circuit may include a forward scanning or a reverse scanning. When the forward scanning is performed, the first power signal VDD in the first cascade shift register units is a start signal, then the first power signal is at a logic high level, and the second power signal is at a logic low level. When the reverse scanning is performed, the second power signal VSS is a start signal, then the first power signal is at a logic low level, and the second power signal is at a logic high level. Beyond that, when the reverse scanning is performed, the cascade relationship between the shift registers is the same as the forward scanning, and details are not described herein again.

It should be noted that the specific details of each module unit in the gate driving circuit have been described in detail in the corresponding shift register unit, and details are not described herein again.

The example embodiment further provides a driving method of the gate driving circuit, which can be used to drive the above gate driving circuit, and specifically include the followings.

When the first selection signal, the second selection signal, and the voltage signal of the pull-up node are all at a logic high level, the first voltage signal is transmitted to the signal output terminal.

When the first selection signal, the second selection signal, and/or the voltage signal of the pull-up node is at a logic low level, the second power signal is transmitted to the signal output terminal.

Specifically, when the first selection signal ODD, the second selection signal EVEN, and the voltage signal of the pull-up node are all at a logic high level, the output signal of the signal output terminal is at a logic high level. It is possible to realize selective output of the odd rows and even rows. When the voltage signal of the pull-up node or any one of the first selection signal ODD and the second selection signal EVEN is logic low, the output signal of the signal output terminal is at a logic low level.

The present exemplary embodiment also proposes a display panel including a display area and a peripheral area, and the above-described gate driving circuit is provided in the peripheral area.

Based on the above, the present embodiment utilizes the GOA technology to integrate the gate driving circuit on the periphery of the display panel, thereby realizing the design of the narrow bezel panel and reducing the manufacturing cost of the display panel.

The display panel may be an LCD display panel, an OLED display panel, a PLED (Polymer Light-Emitting Diode) display panel, a PDP (Plasma Display Panel), or the like, and there is no specific restrictions on the display panel that is applicable.

The example embodiment also provides a display device including the above display panel. The display device may include any product or component having a display function, such as a mobile phone, a tablet computer, a television, a notebook computer, a digital photo frame, a navigator, and the like.

According to the shift register unit, the driving method of the shift register unit, the gate driving circuit, and the display panel thereof provided by the exemplary embodiment of the present disclosure, a logic high level signal or logic low level signal may be transmitted to the signal output terminal under the control of the voltage signal pull-up node together with the first selection signal and/or the second selection signal of the output control circuit, thereby realizing the selective output of signals, further realizing selective scanning and two-way scanning at the same time, improving the detection precision, and providing more display images.

By considering the specification and practicing contents disclosed herein, those skilled in the art will readily conceive of other embodiments of the present disclosure. This application is intended to cover any variations, uses, or adaptations of the present disclosure which follow the general principles of the present disclosure and include any common knowledge or conventional techniques in this technical field not disclosed in this disclosure. The description and examples are to be considered exemplary only, and the true scope and spirit of the disclosure are indicated by the appended claims.

What is claimed is:

1. A shift register unit, comprising:
   an input circuit, configured to transmit a first power signal to a pull-up node under control of an input signal;
   a pull-up circuit, configured to transmit a clock signal to a first node under control of a voltage signal of the pull-up node;
   a storage capacitor, connected between the pull-up node and the first node;
   an output circuit, configured to transmit a first voltage signal to a signal output terminal under control of the first voltage signal; and
   an output control circuit, configured to transmit the first voltage signal or a second power signal to the signal output terminal under control of the voltage signal of the pull-up node and a first selection signal, and to transmit the first voltage signal or the second power signal to the signal output terminal under control of the voltage signal of the pull-up node and a second selection signal,
   wherein the output control circuit comprises;
   a first switching element, having a control and connected to the pull-up node, a first end configured to receive the second power supply signal, and a second end connected to a first end of a second switching element;
   a second switching element, having a control end configured to receive at least one of the first selection signal and the second selection signal, the first end connected to the second end of the first switching element, and a second end connected to a control end of a third switching element; and the third switching element, having the control end connected to the second end of the s second switching element, a first end configured to receive the second power signal, and a second end connected to the signal output terminal.

2. The shift register unit according to claim 1, wherein the output circuit comprises:
a fourth switching element, having a control end and a first end both configured to receive the first voltage signal, and a second end connected to a control end of a third switching element; and
a fifth switching element, having a control end and a first end both configured to receive the first voltage signal, and a second end connected to the signal output terminal.

3. The shift register unit according to claim 1, further comprising:
a reset circuit, configured to transmit the second power signal to the pull-up node or to the first node under control of a reset signal; and
a noise reduction circuit, configured to transmit the second power signal to the first node under control of the first voltage signal.

4. The shift register unit according to claim 1, wherein the input circuit comprises:
a sixth switching element, having a control end configured to receive the input signal, a first end configured to receive the first power signal, and a second end connected to the pull-up node.

5. The shift register unit according to claim 1, wherein the pull-up circuit comprises:
a seventh switching element, having a control end connected to the pull-up node, a first end configured to receive the clock signal, and a second end connected to the first node.

6. The shift register unit according to claim 3, wherein the noise reduction circuit comprises:
an eighth switching element, having a control end connected to the pull-up node, a first end configured to receive the second power signal, and a second end connected to a control end of a ninth switching element;
the ninth switching element, having the control end connected to the second end of the eighth switching element, a first end configured to receive the second power signal, and a second end connected to the first node; and
a tenth switching element, having a control end and a first terminal both configured to receive the first voltage signal, and a second end connected to the control end of the ninth switching element.

7. The shift register unit according to claim 3, wherein the reset circuit comprising:
an eleventh switching element, having a control end configured to receive the reset signal, a first end configured to receive the second power signal, and a second end connected to the pull-up node; and
a twelfth switching element, having a control end configured to receive the reset signal, a first end configured to receive the second power signal, and a second end connected to the first node.

8. A gate driving circuit, comprising: a plurality of cascaded shift register units which comprises;
an input circuit, configured to transmit a first power signal to a pull-up node under control of an input signal;
a pull-up circuit, configured to transmit a clock signal to a first node under control of a voltage signal of the pull-up node;
a storage capacitor, connected between the pull-up node and the first node;
an output circuit, configured to transmit a first voltage signal to a signal output terminal under control of the first voltage signal; and
an output control circuit, configured to transmit the first voltage signal or a second power signal to the signal output terminal under control of the voltage signal of the pull-up node and a first selection signal, and to transmit the first voltage signal or the second power signal to the signal output terminal under control of the voltage signal of the pull-up node, and a second selection signal,
wherein,
an output signal of the signal output terminal of an Mth cascaded shift register unit is used as the input signal of an (M+3)th cascaded shift register unit; and
an output signal of the signal output terminal of the (M+3)th cascaded shift register unit is used as a reset signal of the Mth cascaded shift register unit.

9. The gate driving circuit according to claim 8, wherein the clock signals of adjacent two rows of the cascaded shift register units having substantially inverse phases.

10. The gate driving circuit according to claim 8, wherein a scanning mode of the gate driving circuit comprises a forward scanning, and the first power signal is at a logic high level, and the second power signal is at a logic low level.

11. The gate driving circuit according to claim 8, wherein a scanning mode of the gate driving circuit comprises a reverse scanning, and the first power signal is at a logic low level, and the second power signal is at a logic high level.

12. A display panel, comprising a display area and a peripheral area; wherein the gate driving circuit according to claim 8 is provided in the peripheral area.

13. A driving method of shift register units, configured to drive the shift register unit which comprises;
an input circuit, configured to transmit a first power signal to a pull-up node under control of an input signal;
a pull-up circuit, configured to transmit a clock signal to a first node under control of a voltage signal of the pull-up node;
a storage capacitor, connected between the pull-up node and the first node;
an output circuit, configured to transmit a first voltage signal to a signal output terminal under control of the first voltage signal; and
an output control circuit, configured to transmit the first voltage signal or a second power signal to the signal output terminal under control of the voltage signal of the pull-up node and a first selection signal, and to transmit the first voltage signal or the second power signal to the signal output terminal under control of the voltage signal of the pull-up node, and a second selection signal,
wherein the method comprises;
when the first selection signal, the second selection signal, and the voltage signal of the pull-up node are all at a logic high level, transmitting the first voltage signal to the signal output terminal; and
when the first selection signal, the second selection signal, and/or the voltage signal of the pull-up node is at a logic low level, transmitting the second power signal to the signal output terminal.

* * * * *